United States Patent
Escobar-Bowser

(10) Patent No.: US 6,492,870 B2
(45) Date of Patent: Dec. 10, 2002

(54) CLASS AB, HIGH SPEED, INPUT STAGE WITH BASE CURRENT COMPENSATION FOR FAST SETTLING TIME

(75) Inventor: Priscilla Escobar-Bowser, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/017,778

(22) Filed: Dec. 13, 2001

(65) Prior Publication Data

US 2002/0121933 A1 Sep. 5, 2002

Related U.S. Application Data

(60) Provisional application No. 60/261,000, filed on Jan. 11, 2001.

(51) Int. Cl.[7] .............................. H03F 3/45; H03F 3/26
(52) U.S. Cl. ...................... 330/255; 330/265; 330/267
(58) Field of Search ............................... 330/255, 265, 330/267

(56) References Cited

U.S. PATENT DOCUMENTS

| 5,177,451 A | | 1/1993 | Lehmann |
| 5,512,859 A | | 4/1996 | Moraveji |
| 5,907,262 A | * | 5/1999 | Graeme et al. ............. 330/255 |
| 6,181,204 B1 | * | 1/2001 | Smith et al. ................ 330/261 |
| 6,278,326 B1 | * | 8/2001 | Murray et al. .............. 330/288 |

FOREIGN PATENT DOCUMENTS

EP 0 963 038 A2 12/1999

* cited by examiner

*Primary Examiner*—Patricia Nguyen
(74) *Attorney, Agent, or Firm*—Alan K. Stewart; Wade James Brady, III; Frederick J. Telecky, Jr.

(57) ABSTRACT

The improved Class AB input stage monitors the needs of base current in the slewing transistors 22–25 and supplies that base current with extremely fast and precise feedback loops 90–93. This allows the input stage quiescent current to be very small and gets rid of the non-linearities associated with the lack of base current available to drive the slewing transistors 22–25 in a conventional prior art Class AB input stage. The input stage is a very efficient, low distortion, high small signals and full power bandwidth Class AB input stage.

10 Claims, 2 Drawing Sheets

CLASS AB, HIGH SPEED, INPUT STAGE WITH BASE CURRENT COMPENSATION FOR FAST SETTLING TIME

This application claims priority under 35 USC §119 (e)(1) of provisional application No. 60/261,000, filed Jan. 11, 2001.

FIELD OF THE INVENTION

This invention generally relates to electronic systems and in particular it relates to a class AB input stage.

BACKGROUND OF THE INVENTION

As the communications technology progresses into higher frequency bands, the requirements for speed in the analog front and back end increase. Operational Amplifier requirements for these applications are not only for a high small signals bandwidth, but also for a high large signals (dynamic) bandwidth. These new Operational Amplifiers need to be even faster than their predecessors in order to ensure low harmonic distortion at high speed.

Large signals bandwidth (BW), or full power bandwidth, is defined as: BW=Slew Rate/2*Vp, where Vp is peak voltage. In other words, the faster the slew rate of the Op Amp, the larger the large signals bandwidth. This also brings better distortion for large signals at high frequencies, mainly due to the fact that the Op Amp will be able to follow faster input signals before it becomes slew rate limited. It is also important to remember that the Op Amp must be power efficient, thus, preferably, only boosting its slewing current during the slewing transitions.

The typical prior art solution to these previously mentioned needs is the Class AB input stage. This topology has the advantage of consuming very low standing current (in absence of input signal or for a small signals input) but capable of boosting its slewing current in the presence of a "large signals" input stimulus.

The limitation of the conventional Class AB bipolar input stage is a base current limitation that translates into the well known non-linearities that typically are associated with this type of input stage. In other words, there is trade off, when setting this input stage, between available base current to drive the slewing transistor and standing current through those slewing transistors. The boosted slewing current is proportional to the input signal seen by the input stage. Typically the best setting has a low quiescent current and becomes base current limited half way through the slewing transition of the largest possible signal swing. Even with this set up the standing current ends up being substantial which is very inefficient, especially in the case of input signals smaller than the full dynamic input range of the Op Amp. The lack of base current to the slewing transistors translates to distortion, due to the time that the slewing transistor takes to turn "on" and return back to its quiescent biasing point after suddenly turning "off".

An example of a prior art class AB input stage is shown in FIG. 1. The circuit of FIG. 1 includes transistors 20–31; current sources 34–37; resistors 40–44; capacitor Cc; input nodes IN+ and IN−; source voltages $V_{CC}$ and $V_{EE}$; and output node 46. Resistors 41–44 have the same value. The slew rate (SR) for the prior art circuit of FIG. 1 is given by the following equation:

$$SR = \frac{|V_{in+} - V_{in-}|}{R_2 \cdot C_c}$$

Vin+ is the voltage at node IN+. Vin− is the voltage at node IN−. $R_2$ is the resistance of resistor 40. Notice that $R_2$ sets the transconductance (gm) of the input stage, which sets the small signals bandwidth, the open loop gain, noise, and large signals bandwidth. $R_2$ is typically set to be around 500 ohms. For a ±10V signal the slewing current is as much as 20V/500 ohm=40 mA. For a one volt step this current would be 1/500=2 mA.

To prevent the non-linearities associated with transistors saturating or turning off during slewing, transistors 20–27 cannot be allowed to ever turn off or even get extremely debiased during slewing. For a 20V step and 40 mA slewing current and beta of 80, the current I must be at least 500 mA, preferably twice that. A 1 mA standing current is wasted if the application never requires the opamp to amplify a signal larger than 1 $V_{pp}$, where $V_{pp}$ is peak-to-peak voltage.

SUMMARY OF THE INVENTION

An improved Class AB input stage monitors the needs of base current in the slewing transistors and supplies that base current in an extremely fast and precise feedback loop. This allows the input stage quiescent current to be very small and gets rid of the non-linearities associated with the lack of base current available to drive the slewing transistors in a conventional prior art Class AB input stage. A very efficient, low distortion, high small signals and full power bandwidth Class AB input stage is provided.

DETAILED DESCRIPTION OF PREFERRED EMBODIMENTS

The input stage described below is an improved Class AB input stage where the needs of base current in the slewing transistors are monitored and supplied in an extremely fast and precise feedback loop. This allows the input stage quiescent current to be very small and gets rid of the non-linearities associated with the lack of base current available to drive the slewing transistors seen in the conventional prior art Class AB input stage. In other words a very efficient, low distortion, high small signals and full power bandwidth Class AB input stage.

Figure 1:
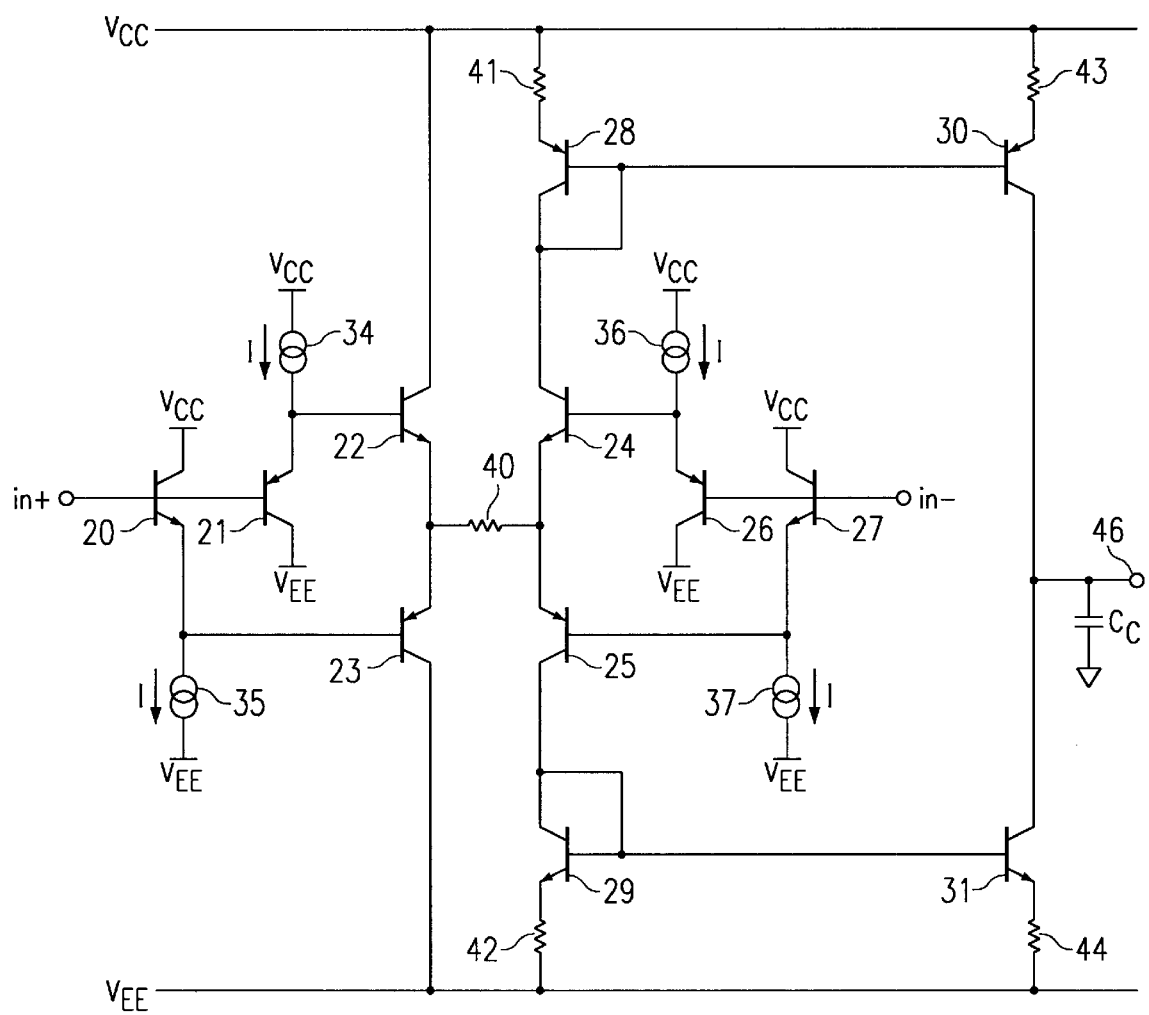
FIG. 1 is a schematic circuit diagram of a prior art class AB input stage.
Figure 2:
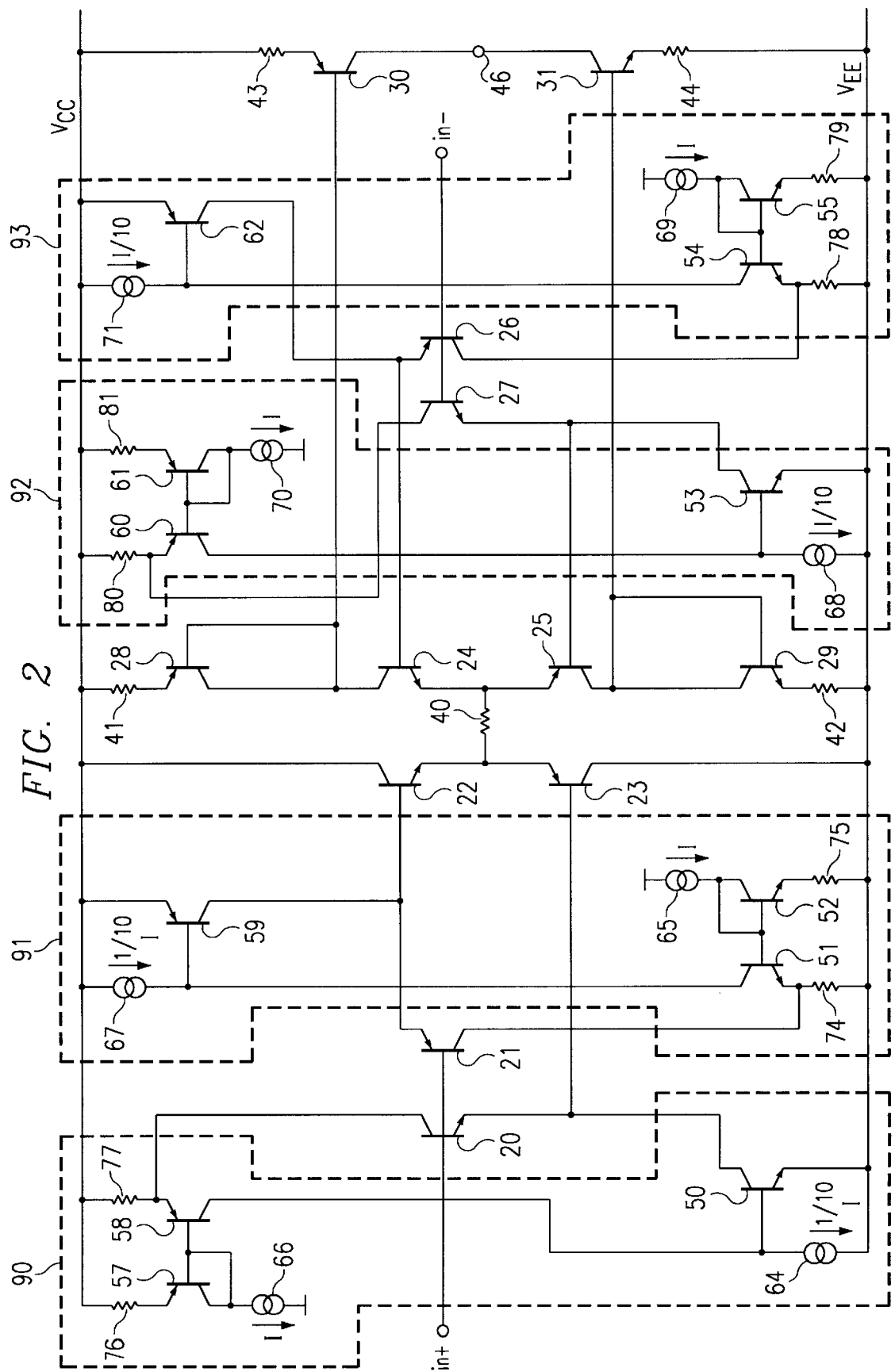
FIG. 2 is a schematic circuit diagram of a preferred embodiment Class AB dynamically biased input stage.

A preferred embodiment Class AB dynamically biased input stage is shown in FIG. 2. The circuit of FIG. 2 includes all the components of the prior art circuit of FIG. 1 without current sources 34–37, and additional circuitry that includes NPN transistors 50–55; PNP transistors 57–62; current sources 64–71; resistors 74–81. Current source 34 of the prior art circuit of FIG. 1 has been replaced by feed back circuit 90 which monitors and supplies the base current to transistor 23 in an extremely fast and precise feedback loop. Current sources 35–37 have been replaced in the same way by feed back circuits 91–93, respectively. Resistors 74–81 have the same value.

The additional feed back circuit 91 works as follows. The current I in current source 65 sets the base-emitter voltage (Vbe) of transistor 52 and the voltage drop across the emitter resistor 75 of transistor 52. This voltage gets imposed onto the base of transistor 51 and its emitter current setting resistor 74. Also, the collector current of transistor 51 gets amplified by the hfe of transistor 59 and serves as a current source to the base of transistor 22 and the biasing transistor 21. Quiescently (in the presence of no resistive load) the base current of transistor 22 is very small, such that most of the current in transistor 59 becomes the collector current of transistor 21. Feed back circuits 90, 92 and 93 work the same way as circuit 91. Thus the current through transistors 20, 21, 26, and 27 set the quiescent operating point of the input stage, which is controlled by the voltage developed at the bases of transistors 52, 55, 57, and 61. These base voltages are set by current sources 65, 66, 69, and 70. During sourcing conditions, the collector currents of transistors 59 and 62 provide base current to transistors 22 and 24, respectively. During sinking conditions, the collector currents of transistors 50 and 53 provide base current to transistors 23 and 25, respectively. Notice that current sources (transistors) 50, 53, 59, and 62 get dynamically modulated by the input signals IN+ and IN− at the bases of transistors 20, 27, 21, and 26, respectively.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A differential input stage of an operational amplifier comprising:
   a first input transistor having a control node coupled to a first input node;
   a second input transistor having a control node coupled to the first input node;
   a third input transistor having a control node coupled to a second input node;
   a fourth input transistor having a control node coupled to the second input node;
   a first slewing transistor having a control node coupled to the first input transistor;
   a second slewing transistor having a control node coupled to the second input transistor and coupled in series with the first slewing transistor;
   a third slewing transistor having a control node coupled to the third input transistor;
   a fourth slewing transistor having a control node coupled to the fourth input transistor;
   a resistor having a first end coupled to the first and second slewing transistors and a second end coupled to the third and fourth slewing transistors;
   a first feed back circuit having an output coupled to the control node of the first slewing transistor and an input coupled to the first input transistor;
   a second feed back circuit having an output coupled to the control node of the second slewing transistor and an input coupled to the second input transistor;
   a third feed back circuit having an output coupled to the control node of the third slewing transistor and an input coupled to the third input transistor; and
   a fourth feed back circuit having an output coupled to the control node of the fourth slewing transistor and an input coupled to the fourth input transistor.

2. The device of claim 1 wherein the first feed back circuit comprises:
   a first feed back transistor coupled to the control node of the first slewing transistor;
   a second feed back transistor coupled between a control node of the first feed back transistor and the first input transistor; and
   a third feed back transistor coupled to a control node of the second feed back transistor.

3. The device of claim 2 further comprising a current source coupled to the control node of the first feed back transistor.

4. The device of claim 3 further comprising a first resistor coupled between the first input transistor and a first voltage source node.

5. The device of claim 4 further comprising a second resistor coupled between the third feed back transistor and the first voltage source node.

6. The device of claim 5 further comprising a second current source coupled between the third feed back transistor and a second voltage source node.

7. The device of claim 1 wherein the second feed back circuit comprises:
   a first feed back transistor coupled to the control node of the second slewing transistor;
   a second feed back transistor coupled between a control node of the first feed back transistor and the second input transistor; and
   a third feed back transistor coupled to a control node of the second feed back transistor.

8. The device of claim 1 wherein the third feed back circuit comprises:
   a first feed back transistor coupled to the control node of the third slewing transistor;
   a second feed back transistor coupled between a control node of the first feed back transistor and the third input transistor; and
   a third feed back transistor coupled to a control node of the second feed back transistor.

9. The device of claim 1 wherein the fourth feed back circuit comprises:
   a first feed back transistor coupled to the control node of the fourth slewing transistor;
   a second feed back transistor coupled between a control node of the first feed back transistor and the fourth input transistor; and
   a third feed back transistor coupled to a control node of the second feed back transistor.

10. The device of claim 1 further comprising:
    a first output transistor having a control node coupled to the third slewing transistor; and
    a second output transistor coupled in series with the first output transistor and having a control node coupled to the fourth slewing transistor.

* * * * *